(12) United States Patent
Cheng et al.

(10) Patent No.: US 7,721,174 B2
(45) Date of Patent: *May 18, 2010

(54) FULL-SPEED BIST CONTROLLER FOR TESTING EMBEDDED SYNCHRONOUS MEMORIES

(76) Inventors: Wu-Tung Cheng, 19030 SW. 35th Pl., Lake Oswego, OR (US) 97034; Christopher John Hill, 14 Blenheim Close, Valley Park, Chandlers Ford, Hampshire, SO53 4LD (GB); Omar Kebichi, 28477 SW. Meadows Loop, Wilsonville, OR (US) 97070

( * ) Notice: Subject to any disclaimer, the term of this patent is extended or adjusted under 35 U.S.C. 154(b) by 467 days.

This patent is subject to a terminal disclaimer.

(21) Appl. No.: 10/985,539

(22) Filed: Nov. 9, 2004

(65) Prior Publication Data

US 2005/0066247 A1 Mar. 24, 2005

Related U.S. Application Data

(63) Continuation of application No. 09/800,092, filed on Mar. 5, 2001, now Pat. No. 6,829,728.

(60) Provisional application No. 60/248,337, filed on Nov. 13, 2000.

(51) Int. Cl.
*G01R 31/28* (2006.01)
*G01R 29/00* (2006.01)

(52) U.S. Cl. .................. 714/733; 714/718; 714/736

(58) Field of Classification Search .................. None
See application file for complete search history.

(56) References Cited

U.S. PATENT DOCUMENTS 4,788,684 A * 11/1988 Kawaguchi et al. ......... 714/719
4,928,278 A * 5/1990 Otsuji et al. ................ 714/700

(Continued)

FOREIGN PATENT DOCUMENTS

EP 1 031 994 A1 2/1999

OTHER PUBLICATIONS

"Adding Pipeline Registers", Built-in Self-Test Process Guide, V8.9_1.10, Mentor Graphics, Dec. 2000, pp. 3-85, 3-86.

(Continued)

*Primary Examiner*—Christine T Tu
(74) *Attorney, Agent, or Firm*—Klarquist Sparkman, LLP

(57) ABSTRACT

A test circuit is disclosed for testing embedded synchronous memories. A BIST controller is used to address the memory and provide reference data that is compared to the memory output. Pipeline registers are used to allow the BIST controller to perform reads and/or writes during every clock cycle. In one aspect, the BIST controller includes a reference data circuit that stores or generates data for comparison to the memory output. A pipeline register is positioned before the reference data circuit or between the reference data circuit and compare circuitry. Additional pipeline registers may be positioned between a compare capture circuit and the compare circuitry. The pipeline registers free the BIST controller from having to wait for a read to complete before starting the next read or write. To reduce the number of pipeline registers needed, a negative-edge BIST controller can be used with a positive-edge memory or vice versa.

15 Claims, 11 Drawing Sheets

U.S. PATENT DOCUMENTS

| | | | |
|---|---|---|---|
| 5,617,531 A | 4/1997 | Crouch et al. | |
| 5,673,271 A | 9/1997 | Ohsawa | |
| 5,961,653 A | 10/1999 | Kalter et al. | |
| 5,968,192 A | 10/1999 | Kornachuk et al. | |
| 5,974,579 A | 10/1999 | Lepejian et al. | |
| 5,995,731 A | 11/1999 | Crouch et al. | |
| 6,000,048 A | 12/1999 | Krishna et al. | |
| 6,006,347 A | 12/1999 | Churchill et al. | |
| 6,011,748 A | 1/2000 | Lepejian et al. | |
| 6,044,481 A | 3/2000 | Kornachuk et al. | |
| 6,070,256 A | 5/2000 | Wu et al. | |
| 6,085,346 A | 7/2000 | Lepejian et al. | |
| 6,108,252 A | 8/2000 | Park | |
| 6,182,257 B1 | 1/2001 | Gillingham | |
| 6,438,048 B1 * | 8/2002 | Kumar | 365/201 |
| 6,560,740 B1 | 5/2003 | Zuraski et al. | |
| 6,587,979 B1 | 7/2003 | Kraus et al. | |
| 6,643,807 B1 | 11/2003 | Heaslip et al. | |
| 6,675,329 B1 * | 1/2004 | Im | 714/718 |

OTHER PUBLICATIONS

"MBIST Architect Command Dictionary", MBIST Architect Reference Manual, V8.9_1.10, Mentor Graphics, Dec. 2000, p. 2-96.

Burgess, "Test and Diagnosis of Embedded Memory Using BIST," *EE-Evaluation Engineering*, Mar. 2000.

Mentor Graphics, "Built-In Self-Test Process Guide, Software Version 8.9_1.10," Dec. 2000.

* cited by examiner

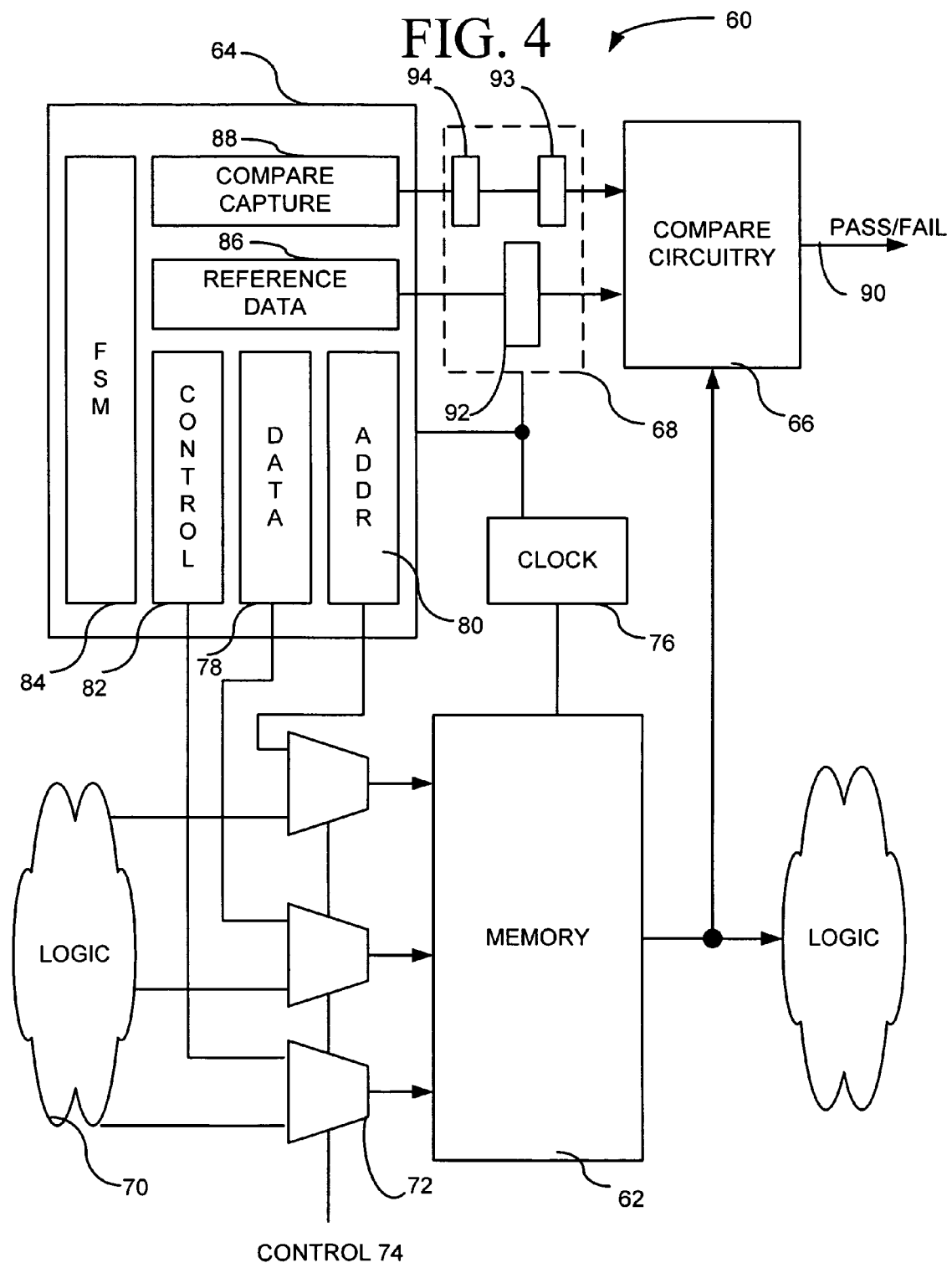

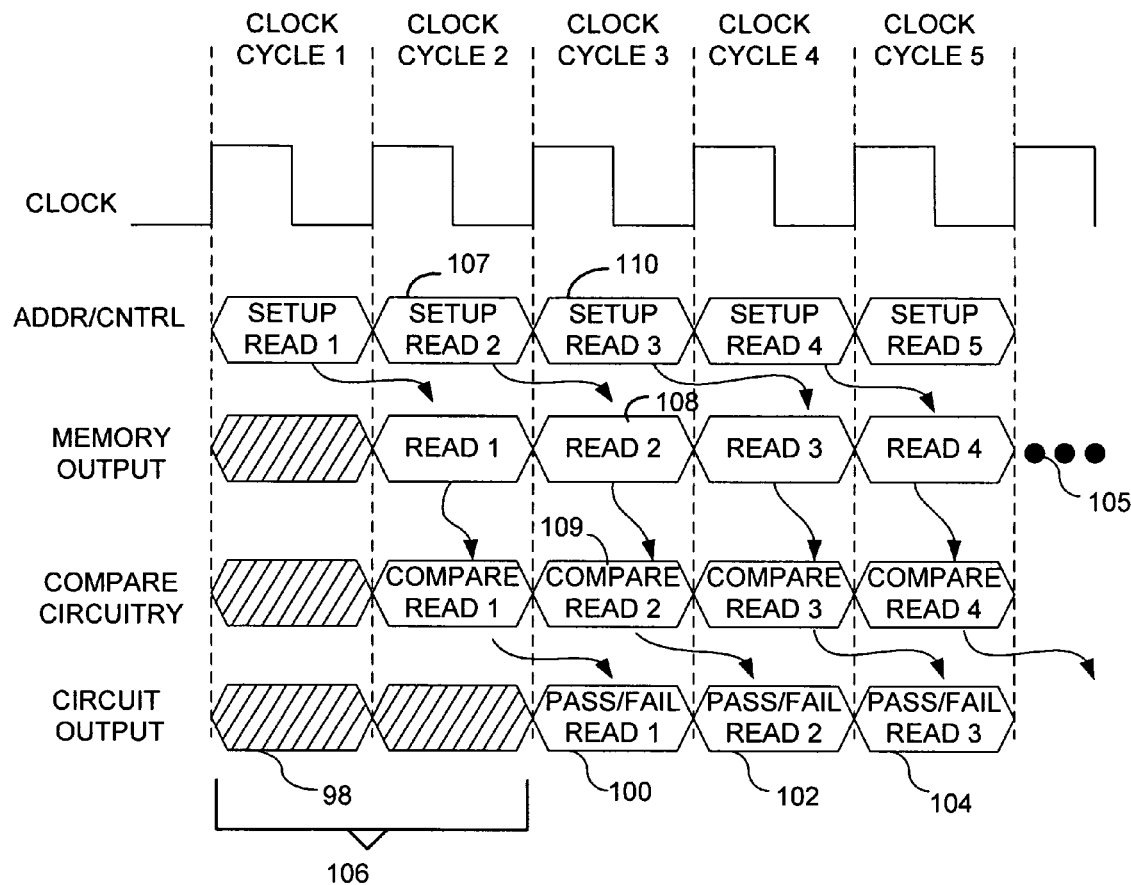

1

FULL-SPEED BIST CONTROLLER FOR TESTING EMBEDDED SYNCHRONOUS MEMORIES

RELATED APPLICATION DATA

This application is a continuation of U.S. patent application Ser. No. 09/800,092, filed Mar. 5, 2001, now U.S. Pat. No. 6,829,728 which claims the benefit of U.S. Provisional Patent Application No. 60/248,337, filed Nov. 13, 2000, both of which are hereby incorporated herein by reference.

TECHNICAL FIELD

This invention generally relates to built-in self testing of electronic circuits, and more particularly relates to built-in self testing of embedded synchronous memories within an integrated circuit.

BACKGROUND

Many of today's integrated circuit (IC) designs are a complete system on a chip (SOC) that include a processor core, multiple embedded memories, logic, I/O ports, etc. Embedded memories are the densest components within a SOC, accounting for up to 90% of the chip area. Memories are also the most sensitive to manufacturing process defects, making it essential to thoroughly test them in a SOC.

As ICs are produced with greater levels of circuit density, efficient testing schemes that guarantee very high fault coverage while minimizing test cost and chip area overhead have become essential. However, as the complexity of circuits continues to increase, high-fault coverage of several types of fault models becomes more difficult to achieve with traditional testing paradigms.

There are generally three approaches to testing of embedded memories. One technique is to use automatic test equipment (ATE) that is located external to the circuit under test and that applies test patterns stored in the ATE. FIG. 1 is a block diagram of a conventional system 18 for testing digital circuits with scan chains. External ATE 20 applies a set of fully specified test patterns 22 one by one to a circuit under test 24 in scan mode via scan chains 26 within the circuit. The circuit is then run in normal mode using the test pattern as input, and the test response to the test pattern is stored in the scan chains. With the circuit again in scan mode, the responses are routed to the tester 20, which compares the response with the fault free reference response 28. This approach is advantageous because there are a wide variety of test algorithms that can be used and the algorithms can easily be changed in the ATE. However, as the complexity of circuits continues to increase, the ATE approach to testing embedded memories has become increasingly difficult. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. Fourth, present external testing equipment is unable to test such larger circuits at their speed of operation, unless prohibitively expensive ATEs are used. Testing at the speed of operation allows for the detection of timing faults that might otherwise be undetected at slower speeds. This is particularly significant for memories that operate at very high speed.

Another technique for testing of embedded memories is to use an embedded CPU. Using an embedded CPU is advantageous because no additional testing hardware is needed and the test algorithms can be easily modified. However, the CPU does not always have access to all of the memories on the integrated circuit. Additionally, it is difficult to automate the process to program the CPU for generation of the memory test algorithms. Finally, it is very difficult to test the memories that store the memory test program itself.

The third approach to testing embedded memories is to use Built-in self-test (BIST) techniques. BIST has become the most popular method for testing embedded memories. To use this method, one or more BIST controllers are inserted within the SOC during the chip's design using a software design tool. The chip is then fabricated with the added BIST controllers. During testing of the fabricated chip, a BIST controller is instructed to supply a series of patterns to the ports of an embedded memory. These patterns, also called test algorithms, typically include, but are not limited to, march-type and checkerboard-type patterns that cause a memory to produce deterministic output data. The output data can be directly compared with reference data from the BIST controller. The comparison generates a signal indicating that the memory passed or failed the test.

Unfortunately, BIST requires additional hardware overhead and there is a performance penalty of BIST controllers and access logic. However, as memory sizes continue to increase, the hardware overhead is becoming relatively small. There are several advantages to BIST. The BIST circuitry generates a wide variety of memory test algorithms to achieve a high quality test. Additionally, BIST provides diagnostic resolution down to one memory cell. Finally, BIST can operate with a very low cost ATE.

FIG. 2 shows a prior art BIST designed for testing embedded memories. A BIST controller 30 includes a finite state machine 32 and control, data, and address registers 34-36, respectively, for reading and writing data to a memory 38. Other logic, shown generally at 40, represents the core logic that performs the IC's functions during normal operation. Multiplexers 42 are used to switch the IC from a test mode (where the BIST controller 30 controls the memory 38) to an operational mode (where the logic 40 reads and writes memory 38). In the test mode, compare circuitry 44 is used to compare values read from memory 38 to reference data 46 stored in the BIST controller 30. Once the compare is completed, the compare circuitry 44 is responsive to a compare capture register 48 in the BIST controller to output the resulting data, which indicates whether the read passed or failed. Although not shown, a clock controls both the BIST controller and the memories being tested so that the two are synchronized. Also, although only one memory is shown in FIG. 2, typically, a BIST controller tests multiple memories.

FIG. 3A shows a timing diagram for a read operation of the circuit of FIG. 2. The read operation takes three clock cycles to complete. During a first clock cycle, the control and address registers 34, 36 of the BIST controller 30 are set up for a read operation. This typically includes storing an address of the desired memory element in the address register 36 and setting the control register 34 for a read operation. On the next clock cycle, the memory outputs the data to the compare circuitry 44. During this cycle, the compare circuitry compares the value read from memory with the reference data supplied from register 46. The compare circuitry 44 then determines whether the reference data matched (passed) the memory data or whether it did not match (failed). On a third clock cycle, the compare circuitry 44 outputs the pass/fail signal as controlled by the compare capture register 48. After the first read is completed, a second read begins that requires three additional clock cycles.

FIG. 3B shows a write operation for the circuitry of FIG. 2. The write operation requires two clock cycles. During a first clock cycle, the BIST controller 30 stores the address of the desired memory location in the address register 36. The BIST controller also stores the data to be written in the data register 35 and places the control register 34 in the proper configuration for a memory write. On the next clock cycle, the memory writes the data from data register 35 to the memory addressed by the address register 36. Every subsequent write operation requires two additional clock cycles.

There are several problems with the prior art test circuitry of FIG. 2. Foremost, the read operation requires three clock cycles to complete and a write requires two cycles to complete. In normal operation, the memory can run much faster. As a result, some timing faults may go undetected. Additionally, the overall testing time is extremely long because of the long read and write cycles. As memory sizes continue to increase, overall testing time will also increase.

Thus, there is a need for a test circuit that tests memory at full-speed and that requires less overall test time to complete a memory test.

SUMMARY

The present invention provides a test circuit to test embedded memory in an integrated circuit. The test circuit performs the test on memory at nearly three times the speed of prior testing circuits. Additionally, the test circuit provides better quality because timing faults within the memory are more easily detected when running the memory at higher speed than prior circuits.

In one aspect, a pipelined architecture is used to allow the BIST controller to perform reads and/or writes of memory on consecutive clock cycles. Thus, instead of a read requiring three clock cycles to complete, the present invention allows reads to occur in consecutive clock cycles. Additionally, the time for a write is reduced from two clock cycles to a single clock cycle.

In another aspect, the pipelining is accomplished using registers positioned between compare circuitry, which is receiving the output of the memory under test, and a reference data circuit. Additionally, compare capture signals from the BIST controller may also be pipelined.

In another aspect, the pipelined architecture can use either a negative-edge BIST controller or a negative-edge memory. Such a structure avoids any hold-time violations in the circuit.

Using the pipelined architecture, the BIST controller performs reads and/or writes on every clock cycle after an initial setup period. This allows the memory to be tested at a much higher rate than traditional testing circuitry. Additionally, the memory is forced to operate at a faster rate, which facilitates detection of timing errors.

The foregoing and other objects, features, and advantages of the invention will become more apparent from the following detailed description of a several embodiments which proceeds with reference to the accompanying figures.

BRIEF DESCRIPTION OF THE DRAWINGS

FIG. 4 shows one embodiment of the test circuitry according to the invention having pipelined registers for allowing reads and/or writes of memory on consecutive clock cycles.

FIG. 5 shows a timing diagram illustrating consecutive read operations every clock cycle for the BIST controller of FIG. 4.

DETAILED DESCRIPTION

Figure 1:
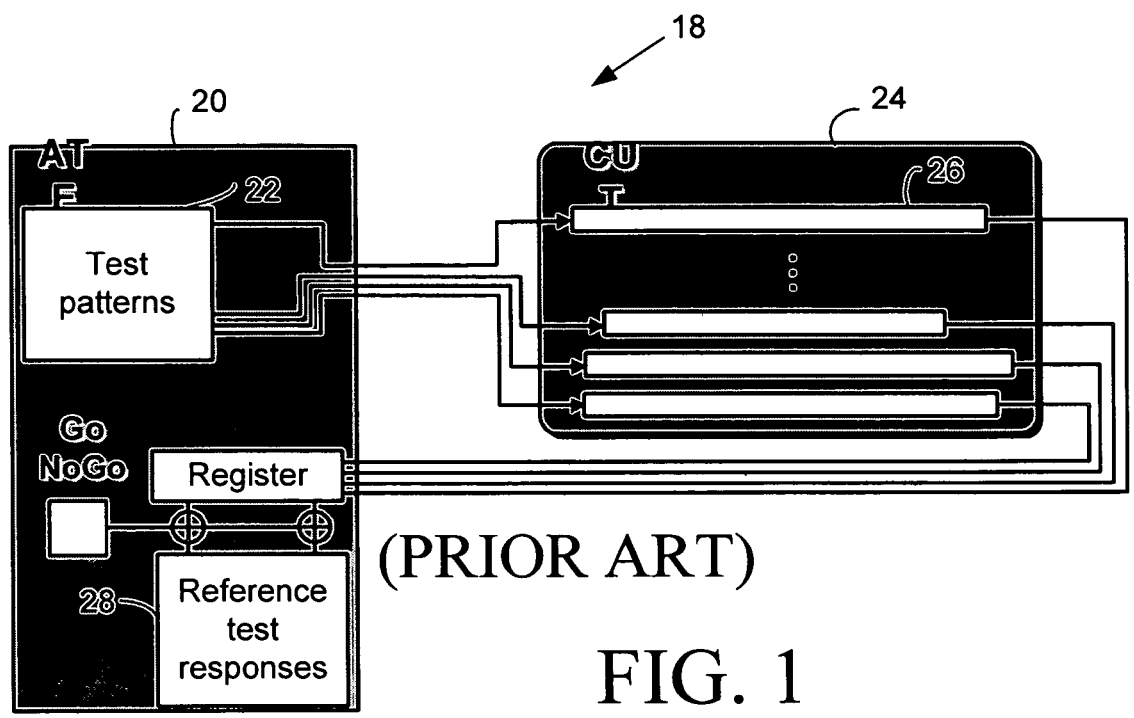
FIG. 1 shows a prior art technique for testing an integrated circuit by using external automated test equipment (ATE).
Figure 2:
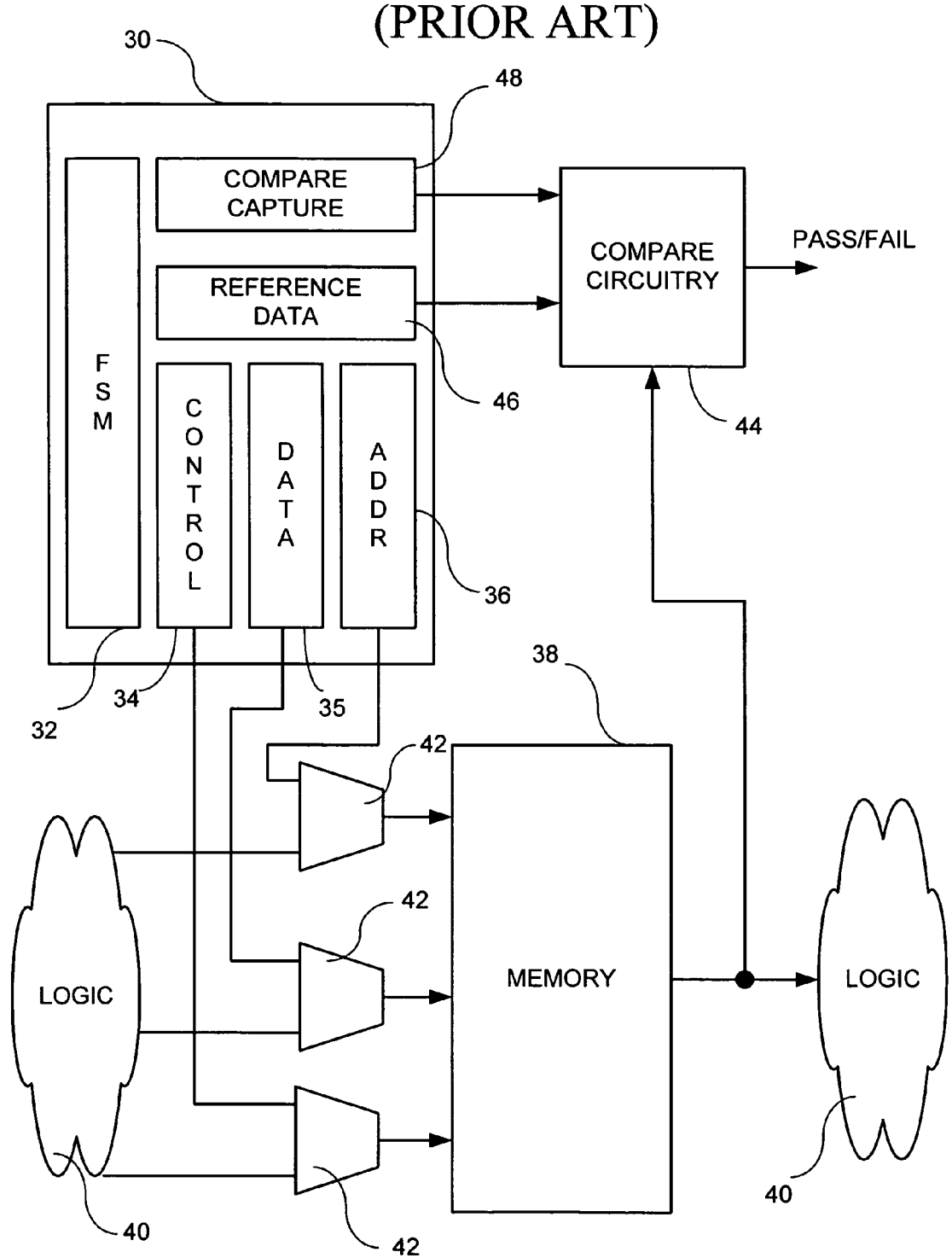
FIG. 2 shows a prior art circuit for testing memory using a BIST controller.

FIG. 4 shows a test circuit 60 for testing a memory 62. The test circuit 60 includes a BIST controller 64, compare circuitry 66, and pipelining logic 68. The illustrated integrated circuit that has two modes of operation: a normal operating mode and a test mode. In the normal operating mode, logic shown generally at 70 interacts with the memory 62 by way of multiplexers, such as multiplexer 72, that switch control between the logic 70 and the BIST controller 64 based on a control signal 74. A clock 76 synchronizes the BIST controller 64, the memory under test 62, and the pipelining logic 68. Data and address registers 78 and 80 within the BIST controller are used to read and write to the memory. A control register 82 within the BIST controller is used to place the memory under test 62 in the proper state for a read or write operation. For example, the control register 82 may be coupled to a read enable port or a write enable port on the memory 62. Other control configurations may also be used depending on the memory and particular design, as is well-understood in the art. A finite state machine 84 is used to control the timing and operation of the BIST controller 64. A reference data circuit 86 generates or stores the expected data value that is to be read from memory. In the case where the reference data circuit generates the expected data value, the circuit 86 may be coupled to the finite state machine that provides the necessary data or control signals so the circuit 86 can generate the appropriate expected data value. In the case where the reference data circuit is a register, the register simply stores the appropriate value. The expected data value is provided to the compare circuitry 66. The compare circuitry, in turn, compares the expected data value to the actual data read from memory. If the expected data value matches the actual data value, the compare circuitry outputs a pass signal. If there is no match, the compare circuitry outputs a fail signal. A compare capture circuit 88 is used to control the compare circuitry 66 to provide the necessary output 90. For example, the compare capture circuit 88 may control an output enable port on a comparator (not shown) within the compare circuitry 66. Alternatively, the compare capture circuit may control a latch (not shown) within the compare circuitry 66 that latches the output of a comparator to provide the output 90. The compare capture circuit 88 may be a simple register that stores a data value, or it may generate a data based on inputs from the finite state machine.

There are numerous forms the compare circuitry can take, and any such forms can be used with the test circuit. The reference data circuit 86 typically generates or stores data that is the same size as a memory word from memory 62. Typical sizes include 8, 16, and 32 bits, but other sizes can be used. The compare capture circuit 88 is typically only one bit wide.

Pipelining logic 68 may take many forms. In the example of FIG. 4, the pipelining logic 68 includes three registers 92-94. These registers capture either the reference data or the compare capture data and delay such data either one or two clock cycles to the compare circuitry 66. For example, the pipeline register 92 for the reference data is a storage device (e.g., latch or flip-flop) that is typically the same size as the memory word (8 bit, 16 bit, 32 bit, etc.) and that stores the reference data until the next clock cycle. Thus, the reference data is delayed one full clock cycle before reaching the compare circuitry. Pipeline registers 93, 94 are typically coupled in series, are one bit wide, and are used to store the compare capture data and delay it two clock cycles before it reaches the compare circuitry 66.

The BIST controller is shown very generically and there are a wide variety of forms the BIST controller can take. For example, the registers and circuitry shown within BIST controller 64 may be replaced with combinatorial logic that is controlled by the finite state machine. Such combinatorial logic can be used in conjunction with other internal signals within the BIST controller to produce the desired output signals, such as address, data, and control lines. There are many variables that can affect the internal signals to the combinatorial logic, such as the current data pattern being used and the address of memory currently being tested. The particular structure of the BIST controller is not of importance to the invention.

Although the pipeline registers are shown outside the BIST controller, these registers can be included within the BIST controller as is well understood in the art. Additionally, the pipeline registers can be moved into the compare circuitry. Still further, the compare circuitry can be moved into the BIST controller with the pipeline registers. Thus, the physical location of any of the compare circuitry, pipeline registers, and BIST controller can be rearranged and partitioned according to the desired implementation. The pipelining logic 68 may also be moved before the reference data circuit 86 and compare capture circuit 88. The pipelining in essence creates a temperal delay to allow other logic within the BIST controller to perform tasks before the comparison. To create the temperal delay, the pipeline registers should be placed somewhere between the BIST controller state storage elements and the comparator (e.g., before or after registers 86, 88).

FIG. 5 shows a timing diagram 96 for consecutive read operations using the test circuit 60 of FIG. 4. The timing diagram 96 shows five clock cycles of the continuously running clock 76. Listed along the left hand side of the timing diagram are the different signals for the test circuit 60. For example, the ADDR/CNTRL symbol illustrates whether the address register 80 and the control register 82 contain valid data needed for a read operation of the memory 62. At any point in the timing diagram where the signals from the test circuit 60 are not valid or do not matter, the timing diagram illustrates such periods of time with diagonal lines, such as indicated at 98. Valid data is shown with a description of the operation being performed (e.g., Read 1).

Figure 3A:
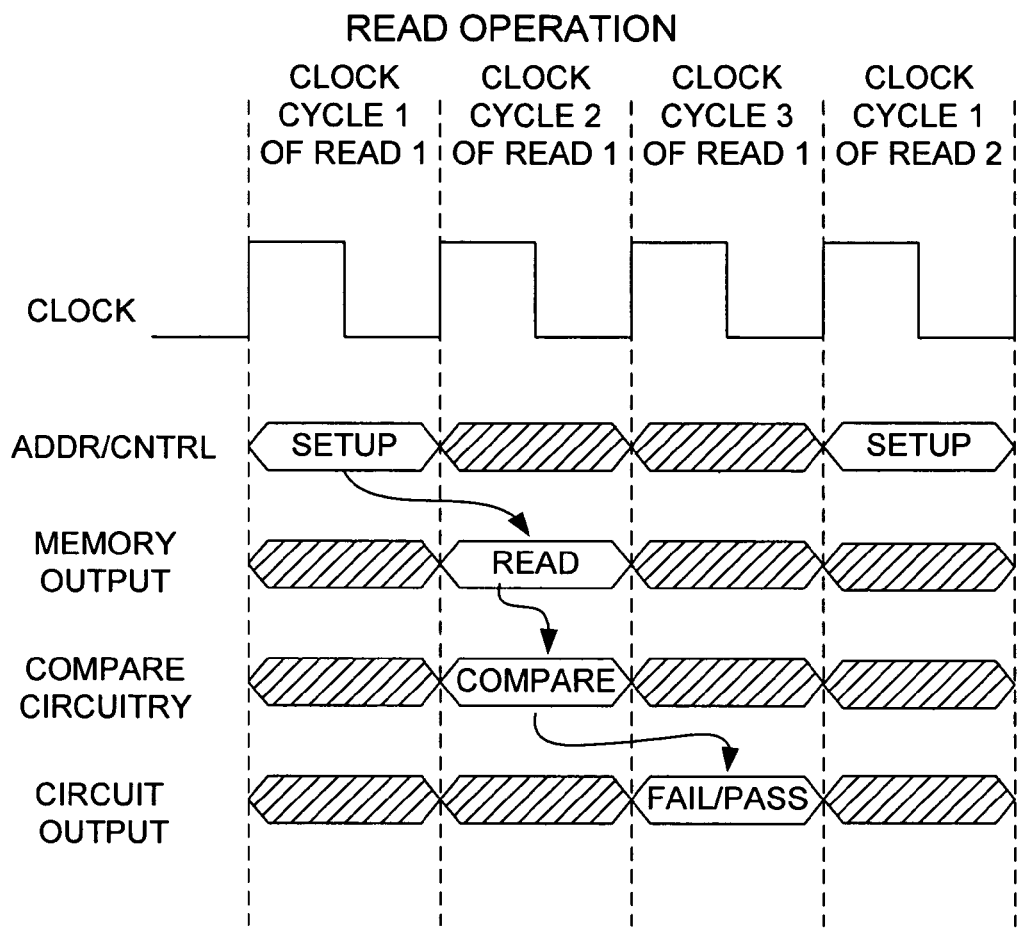
FIG. 3A shows a timing diagram for a read operation executed by the BIST controller of FIG. 2.
Figure 3B:
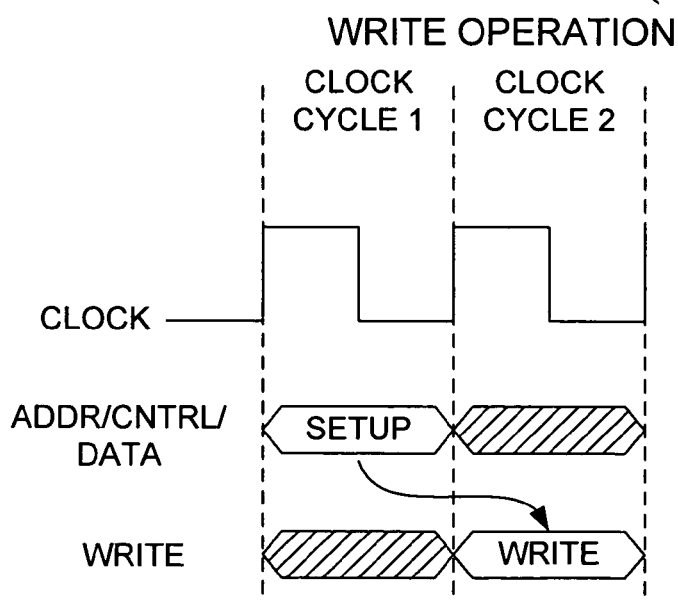
FIG. 3B shows a timing diagram for a write operation executed by the BIST controller of FIG. 2.

The timing diagram illustrates that the test circuit provides valid output data on consecutive clock cycles. For example, the circuit output 90 (FIG. 4) provides a first pass/fail signal during clock cycle 3 (see 100) indicating whether a first read passed or failed. During clock cycle 4, the circuit output 90 provides a second pass/fail signal (see 102) for a second read. On clock cycle 5 the circuit output provides a third pass/fail signal (104) for a third read. This cycle of performing consecutive pass/fail signals for different reads on every clock cycle can continue indefinitely as indicated at 105. Thus, | the test circuit 60 can provide pass/fail signals for every clock cycle of memory and for memory reads of different memory addresses. As can be seen in FIG. 3A, the prior art circuit requires three clock cycles to complete every read.

It should be noted that the first two clock cycles shown generally at 106 (FIG. 5) are an initial setup period wherein reads do not occur. However, for large memories, these two first clock cycles are negligible.

Further details of the timing diagram of FIG. 5 are now described. During the first clock cycle, the address register 80 and the control register 82 are loaded by the finite state machine 84 with the proper address of the memory word being tested and the proper control signals for a read operation (e.g., read enable). Additionally, the finite state machine 84 provides control signals to the reference data circuit 86 so that it can generate the expected data to be read from memory. Alternatively, the finite state machine loads the expected data value into the reference data circuit. The finite state machine 84 also loads the compare capture circuit 88 with the necessary control bit to control the compare circuitry 66. Alternatively, the finite state machine may provide control signals to the compare capture circuit so that the circuit 88 generates the necessary control bit.

On the front edge of a second clock cycle, the data provided by the reference data circuit 86 is latched into pipeline register 92 and is therefore provided to the compare circuitry. Likewise, the data provided by the compare capture circuit 88 is latched in the first pipeline register 94. The memory 62 outputs the data (i.e., memory word) stored in the memory location addressed by the address register 80. The clock cycle from clock 76 has a sufficient period to allow the compare circuitry 66 to receive the data from the memory and perform a compare operation. Thus, the compare circuitry 66 compares the reference data stored in pipeline register 92 and the memory output. The compare circuitry can be a comparator performing a bit-by-bit comparison or other type of circuitry that is well understood in the art. The compare circuitry finishes the compare during clock cycle 2.

Simultaneously, during clock cycle 2, the BIST controller 64 reloads (or provides new control signals) the address registers 80, control register 82, reference data circuit 86, and the compare capture circuit 88 so that new values can be generated or used for the next clock cycle. Thus, during the second clock cycle, while the first read is completing, the BIST controller 64 sets up for a second read as indicated at 107.

During a third clock cycle, data stored in pipeline register 94 is transferred to pipeline register 93 which in turn is used to control the compare circuitry during the third clock cycle. Depending on the structure of the compare circuitry, pipeline register 93 will, for example, control an output enable pin on the compare circuitry allowing the compare circuitry to output a pass/fail signal. Alternatively, pipeline register 93 may latch the compare circuitry pass/fail decision in a register (not shown) within the compare circuitry 66. The register then outputs the pass/fail output 90.

Also during the third clock cycle, the finite state machine 84 loads the address registers 80 and the control registers 82 for a third read cycle. Simultaneously, during clock cycle 3, the read of memory for the second read occurs and the compare circuitry 66 performs the comparison for the second read. It should be recognized that by the time the compare circuitry starts performing the compare for the second read, it has already output the result of the first read. Additionally, during the third clock cycle, there are stages of three different reads being performed simultaneously by the test circuit 60. In particular, the results of read 1 are completed as shown at 100; a read occurs for the second read (108) and a compare for the second read (109); and the setup for read 3 is shown at 110. Thus, a pipeline of read operations occurs where different stages of three different reads are done simultaneously to increase efficiency. Clock cycles 4 and 5 are similar to clock cycle 3 for later, successive reads.

Figure 6:
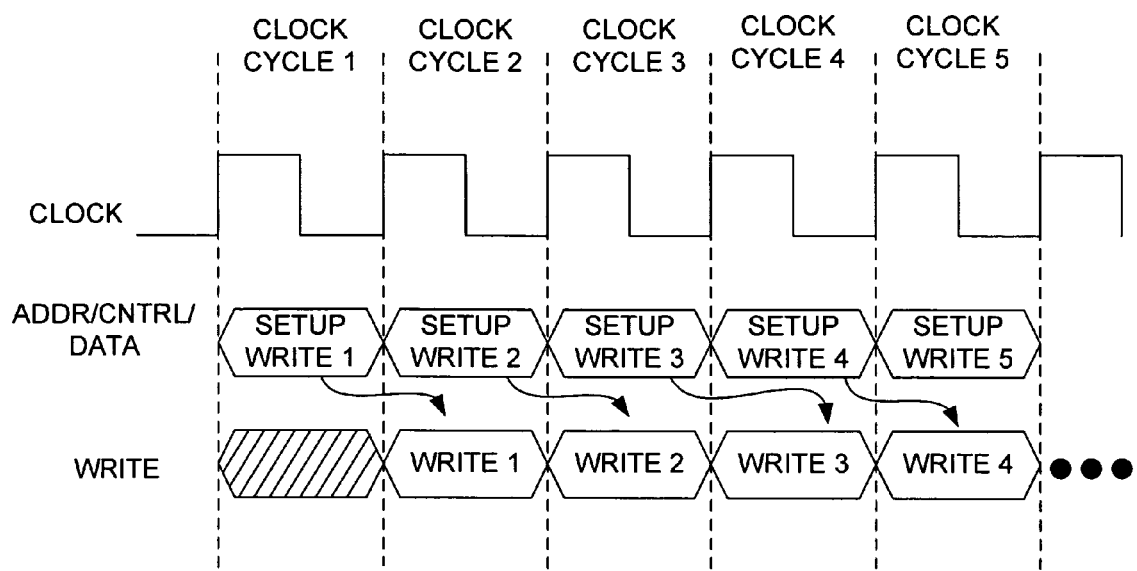
FIG. 6 shows a timing diagram illustrating consecutive write operations every clock cycle for the BIST controller of FIG. 4.

FIG. 6 shows multiple write operations for the test circuit 60 of FIG. 4. As in FIG. 5, the left hand side of the timing diagram shows the timing for the data, address, and control registers 78, 80, and 82 respectively, and when the write is completed in memory 62. During a first clock cycle the data, address, and control lines are loaded by the finite state machine 84 to set up for the first write. During the second clock cycle, the first write is completed and simultaneously the finite state machine 84 reloads the data, address and control registers for the next write cycle. This allows the second write to complete during the third clock cycle. As can readily be seen, every clock cycle (2, 3, 4, 5 . . . ) a different write operation is completed, rather than two clock cycles for every write, as was done in the prior art.

Figure 7:
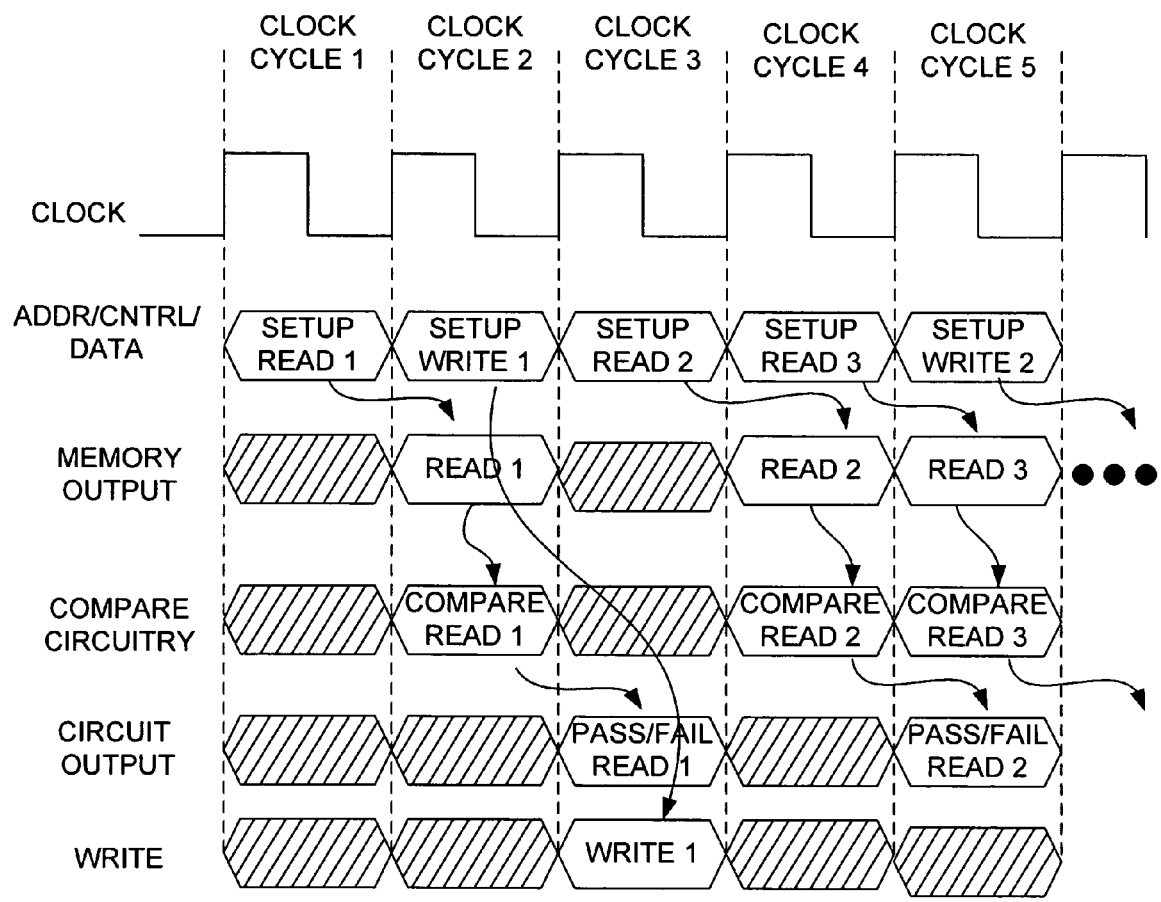
FIG. 7 shows a timing diagram illustrating varied read and write operations using the BIST controller of FIG. 4.

FIG. 7 shows a timing diagram for the test circuit 60 performing varied read and write operations. Although a particular sequence of reads and writes is performed, virtually any sequence of reads and writes can be implemented. For example, FIG. 7 could easily be modified to have alternating reads and writes. The timing diagram is very similar to the timing diagrams of FIGS. 5 and 6, already described. It should be noted, however, that during clock cycle 2, while the read and compare is performed for the first read, the setup for a first write occurs simultaneously (during the same clock cycle). Similarly, during clock cycle 3, the output 90 of the test circuit 60 has the final output of the first read, while simultaneously (during the same clock cycle) a write is completed. Additionally, during clock cycle 3, the BIST controller is setting up for read 2. This pipelining effect allows the single test circuit 60 to perform multiple stages of reads and write operations simultaneously.

Figure 8:
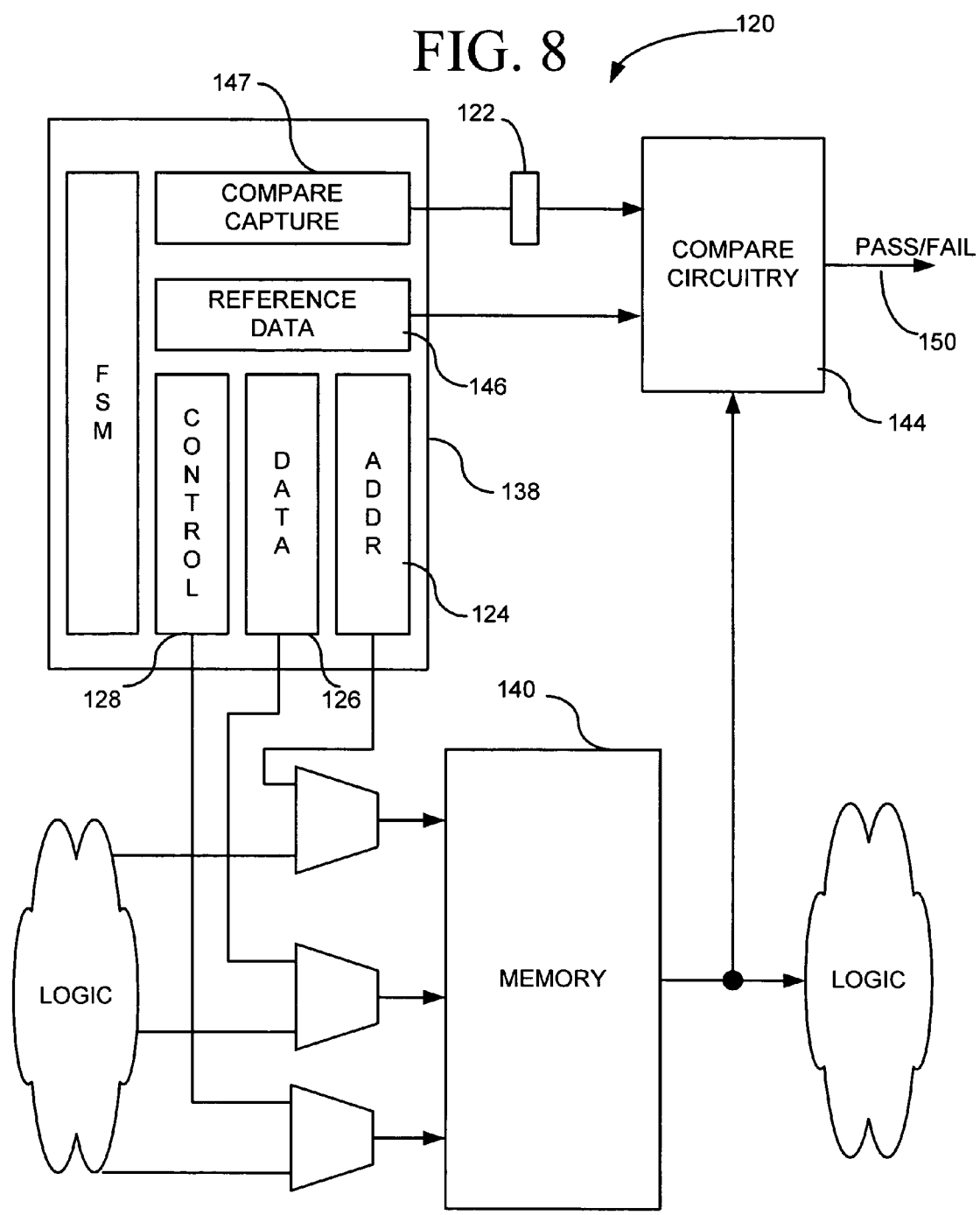
FIG. 8 shows another embodiment of the pipelined test circuitry wherein a negative-edge BIST controller or a negative-edge memory is used.

FIG. 8 shows another embodiment of a test circuit 120. This test circuit also has pipelining as earlier described in relation to FIG. 4. However, the pipelining logic only includes a single pipeline register 122. The circuit of FIG. 8 can be used with either a negative-edge BIST controller or a negative-edge memory. The negative-edge BIST controller is described in relation to the timing diagrams of FIG. 9. The negative-edge memory is described in relation to the timing diagram of FIG. 10. In any event, as can be seen from the comparison of FIG. 4 and FIG. 8, using either a negative-edge BIST controller or a negative-edge memory allows for fewer pipeline registers to be used. Since the pipeline register 92 (FIG. 4) is the same size as a memory word, FIG. 8 provides a substantial savings in area as this register is eliminated.

FIG. 8 also includes address, data and control registers 124, 126, 128, respectively, within a BIST controller 138, similar to that already described in FIG. 4. Similarly, the test circuit 120 includes a memory under test 140 and compare circuitry 144.

Figure 9:
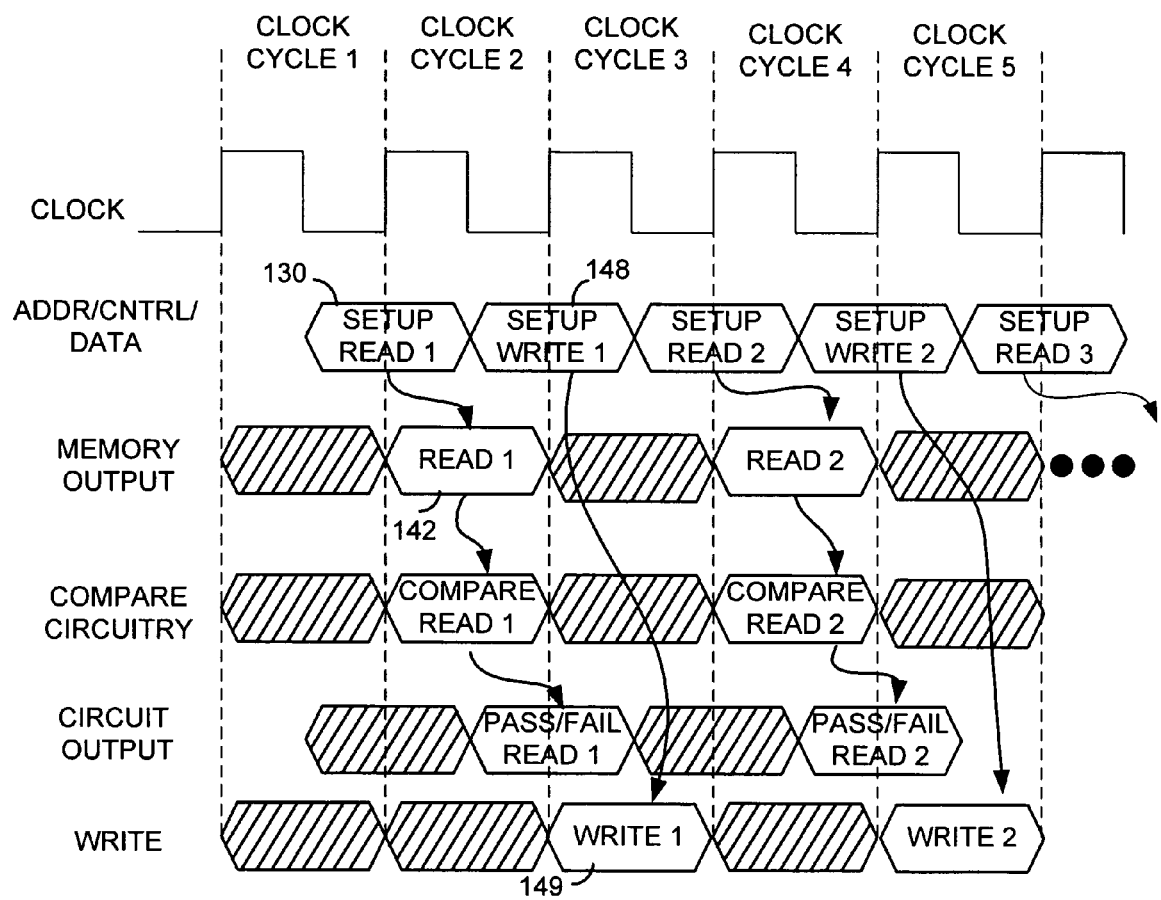
FIG. 9 shows a timing diagram for alternating read and write operations using a negative-edge BIST controller of FIG. 8.

FIG. 9 shows a read/write operation for a negative-edge BIST controller. Although FIG. 9 describes alternating reads and writes, the circuit in FIG. 8 can be used for consecutive reads, consecutive writes, or any varied pattern of reads and writes. With the negative-edge BIST controller, the writing of the address, data and control registers 124, 126, and 128 occurs on the negative edge of a clock cycle. Thus, as shown at 130, during the falling edge of clock cycle 1, the finite state machine writes registers 124 and 128. This provides sufficient hold time for a read operation of memory 140. The memory 140 is a positive edge memory and during the rising edge of clock cycle two, the read operation occurs as shown at 142. Also during clock cycle two, the compare circuitry 144 compares the output of the memory 140 to reference data provided by reference circuit 146. The pipeline register 122 is loaded with a control signal on a negative edge—one cycle after the setup. Once loaded, the pipeline register 122 controls the compare circuitry 144 to provide the circuit output 150. At the same time the circuit output is valid, the BIST controller 138 loads the address, data and control registers 124, 126, 128 to set up for a first write operation as shown at 148. A half clock cycle later, the write is completed as shown at 149. Thus, at every clock cycle, the test circuit 120 can perform alternating read and write operations. This substantially increases the speed and accuracy of the test.

Figure 10:
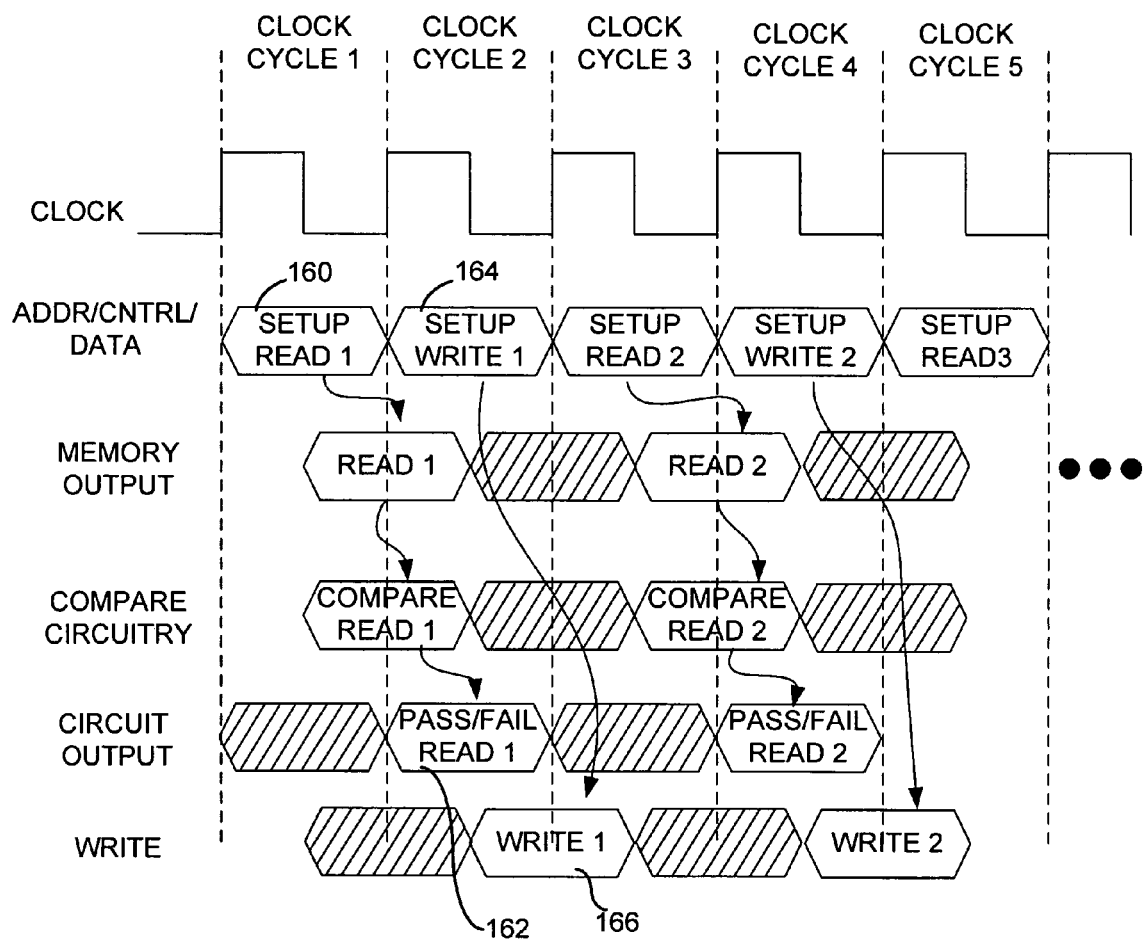
FIG. 10 shows a timing diagram having consecutive read and write operations using a negative-edge memory of FIG. 8.

FIG. 10 shows that the test circuit 120 of FIG. 8 can also be implemented with a negative-edge memory and a positive-edge BIST controller. As shown at 160, the BIST controller 138 writes to the address and control lines 124, 128 to set up for a first read. Also during the rising edge of the first clock cycle, the compare capture circuit 147 is loaded with the appropriate control information to control the compare circuitry 144. Alternatively, the compare capture circuit is provided with signals from the finite state machine so that it may generate the control signal to the compare circuitry. During a falling edge of clock cycle 1, the memory 140 completes the read and the compare circuitry 144 compares the output of memory to the reference data from reference circuit 146.

On the rising edge of clock cycle two, pipeline register 122 is loaded with the compare capture data and controls the compare circuit 144 to output the result of the comparison as shown at 162. Simultaneously, on the rising edge of clock cycle two, the BIST controller 138 performs a setup for the first write as shown at 164. On the falling edge of clock cycle two (one half clock cycle later) the write is completed as shown at 166. Thus, alternating read and write operations occur nearly every clock cycle.

Figure 11:
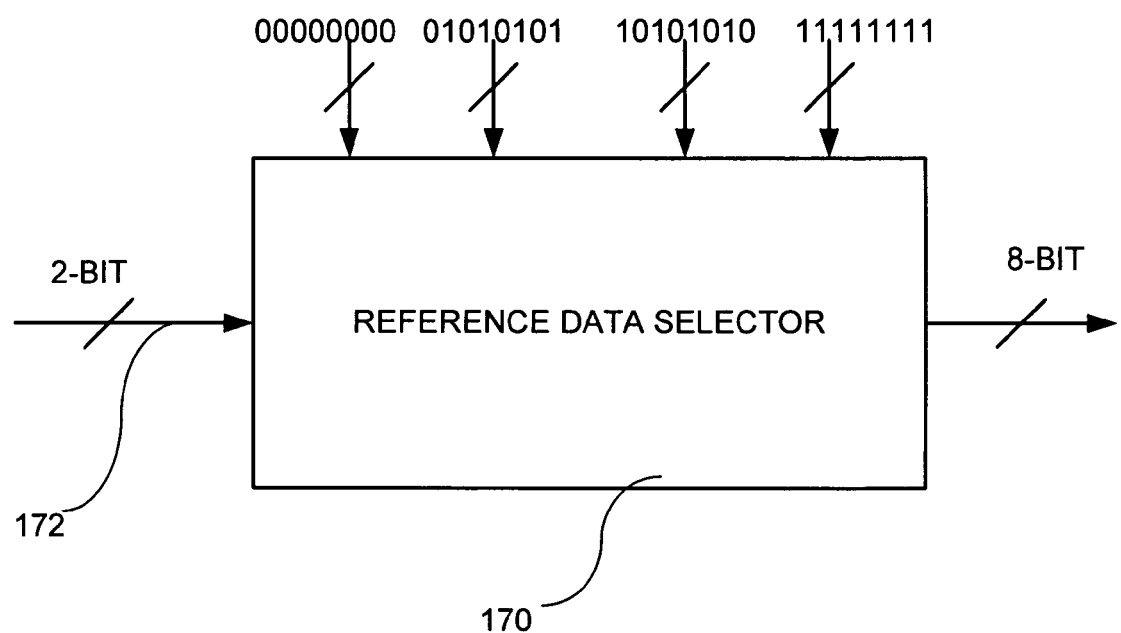
FIG. 11 shows a block diagram illustrating one technique for supplying reference data to the compare circuitry of the test circuits of FIGS. 4 and 8.

FIG. 11 shows another possible embodiment wherein the reference data is controlled by a simple multiplexer or reference data selector 170. As already described, the reference data size is the same size as a memory word. The cost of this wide (e.g., 32 bits) one cycle delay register can be expensive in terms of area. However, in most memory BIST algorithms, the reference data is only a small number of constant patterns. Therefore, the reference data circuit can control the reference data selector that selects which constant to use. Alternatively, the reference data circuit can be the reference data selector and is directly controlled by the finite state machine. This is one example of how the reference data circuit can generate the necessary data.

FIG. 11 shows that there are four constant patterns that are used for an 8-bit wide memory. The four constant patterns are shown as four different buses coupled to the reference data selector 170. The selector has two control pins 172 to select one of these four patterns. Thus, in this example, the delay register is reduced from 8 bits to just 2 bits. Additionally, the reference data selector can be clocked so that it acts as a pipelined register. For marching algorithms, to detect bridging faults among memory bits in the same word, 2 log (N) constant patterns are used for an N-bit wide memory. Therefore the number of control signals needed for the selector is log (2 log(N)). For example, a 256-bit wide memory would have a delay register at the control pins of the reference data selector which would reduce the delay register size from 256 bits to 4 bits.

As already described above, the selector may be included in the BIST controller and may be designed having combinational logic therein. The data patterns generated by the selector may be variable (combinational) data patterns derived from current address being tested and state of the BIST controller.

In some memory designs, two different clocks can control the read and write operation separately. In other words the read clock is not needed during the write operation and the write clock is not needed during the read operation. However, as long as the active read clock has no impact to the write operation and the active write clock has no impact to the read operation, a simple solution is to provide a free running clock to both sources instead of trying to control these two separate clocks. This way, the pipeline registered to create one-cycle delay of memory clock is not needed.

The previous description assumes that all setup signals are synchronous.

However, in some memory designs, setup signals may need to be active before and after the clock edge. For example, certain memory designs require the output enable signal to be active before the read clock edge and after the read clock edge during read operation. To support full-speed consecutive read/write operation, the output enable signal may be active at every cycle. To simplify the design of the BIST controllers, it may be better to turn on output enables all the time. In general, to simplify full-speed pipeline BIST controller design, all synchronous read/write setup signals should be active all the time.

Having illustrated and described the principles of the illustrated embodiments, it will be apparent to those skilled in the art that the embodiments can be modified in arrangement and detail without departing from such principles.

For example, although specific timing diagrams are illustrated, other patterns of reads and writes can be used. For example, any of the embodiments can have a series of consecutive read operations or a series of consecutive write operations. Alternatively, the embodiments can have a variety of interleaved read/write patterns (e.g., read, write, write, read, read, read, write . . . ).

Furthermore, although the pipelined registers are shown outside the BIST controller, the BIST controller can easily be modified to include the pipeline registers. Additionally, the pipeline registers can be moved into the compare circuitry.

Still further, the behavior of the compare circuitry, BIST controller and pipeline registers can be partitioned in a wide variety of ways.

Still further, although a particular structure for the BIST controller is shown, a wide variety of BIST controller structures may be used.

Additionally, although the compare circuitry is shown generically, a wide variety of compare circuits can be used as is well understood in the art.

The illustrated memories are tested by reading and writing memory words, which may be 8 bits, 16 bits, 32 bits, etc.

The example timing diagrams are simplified for purposes of illustration. For example, some of the timing diagrams could be interpreted as showing setup and hold times for reads and writes to memory. Although a memory may require address and data lines to have sufficient setup and hold times, normally such times are sufficiently less than a full clock cycle. Thus, the timing diagrams merely represent that a write and other functions occur during a given clock cycle, and are not representative of setup and hold times.

In view of the many possible embodiments to which the principles of our invention may be applied, it should be recognized that the illustrated embodiments are only examples and should not be taken as a limitation on the scope of the invention. Rather, the scope of the invention is defined by the following claims. We therefore claim as our invention all that comes within the scope of these claims.

We claim:

1. A circuit including a memory, comprising:
   means for switching the circuit between a normal mode of operation wherein logic associated with the functionality of the circuit interacts with the memory and a test mode of operation wherein test logic interacts with the memory;
   means for providing, from the test logic, an expected value of data;
   means for reading, during a read cycle, an actual value of data stored in the memory;
   means for comparing the expected value of data to the actual value of data stored in the memory to provide a result of the comparison; and
   means for delaying the result of the comparison from being output from the means for comparing:
   the means for providing the expected value of data being coupled in parallel, with the means for delaying, to the means for comparing;
   the circuit allowing consecutive reads and compares of the memory on every clock cycle in order to test the memory.

2. The circuit of claim 1, further including means for delaying the expected value of data from being compared.

3. The circuit of claim 2, wherein the means for delaying the result of the comparison from being output includes at least two result-delaying pipeline registers coupled in series and the means for delaying the expected value of the data stored in memory includes one less pipeline register than the result-delaying pipeline registers.

4. The circuit of claim 1, wherein the means for switching includes one or more multiplexers coupled to a control line.

5. The circuit of claim 1, wherein the test logic includes a BIST controller and wherein the means for delaying includes a compare capture register and further including a delay register positioned between the means for comparing and the compare capture register.

6. The circuit of claim 1, wherein the means for reading includes negative-edge triggered registers for setting up the read of the memory during a negative edge of a clock cycle and wherein the memory is a positive-edge triggered memory.

7. The circuit of claim 1, wherein the means for reading includes positive-edge triggered registers for setting up the read of the memory during a positive edge of a clock cycle and wherein the memory is a negative-edge triggered memory.

8. The circuit of claim 1, wherein the means for providing an expected value of data stored in the memory includes means for generating the expected value.

9. The circuit of claim 8, wherein the means for generating includes a finite state machine.

10. A circuit, comprising:
    a memory having an address port, a data port and an output port;
    a BIST controller including a BIST address port coupled to the address port of the memory, a BIST data port coupled to the data port of the memory, a compare capture register, and a reference data register;
    a compare circuit having an output and three inputs including a first input coupled to the compare capture register that controls the output of the compare circuit, a second input coupled to the reference data register that is used to store an expected value, and a third input coupled to the data port of the memory in order to receive an actual value, the compare circuit configured to compare the expected value to the actual value and provide, on the output, a value indicating pass or fail;

at least a first pipeline register coupled between the compare capture register and the compare circuit; and at least a second pipeline register coupled between the reference data register and the compare circuit.

11. The circuit of claim 10, wherein the BIST controller includes a finite state machine that controls the state of the BIST controller.

12. The circuit of claim 11, further including a clock coupled to the BIST controller, the finite state machine changing state in response to the clock, wherein the second pipeline register delays data to be received by the compare circuitry by at least one clock cycle.

13. The circuit of claim 10, further including at least a third pipeline register coupled in series with the first pipeline register.

14. The circuit of claim 10, further including a clock coupled to the BIST controller and the memory wherein the BIST controller writes data to the memory on consecutive clock cycles of the memory to test the memory.

15. The circuit of claim 10, wherein the BIST controller includes an address register coupled to the BIST address port, the address register being loaded on a falling edge of a clock cycle.

* * * * *